(12) United States Patent
Chao

(10) Patent No.: US 7,085,905 B2
(45) Date of Patent: Aug. 1, 2006

(54) MEMORY DATA STRETCHER

(75) Inventor: Fu-Kuang Frank Chao, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 251 days.

(21) Appl. No.: 10/199,389

(22) Filed: Jul. 18, 2002

(65) Prior Publication Data

US 2004/0015670 A1    Jan. 22, 2004

(51) Int. Cl.
*G06F 12/00*    (2006.01)

(52) U.S. Cl. .................. 711/167; 711/165; 711/167; 365/233

(58) Field of Classification Search .............. 711/167, 711/163, 165; 365/233
See application file for complete search history.

(56) References Cited

U.S. PATENT DOCUMENTS

| | | | | |
|---|---|---|---|---|
| 3,947,874 | A * | 3/1976 | Lentz | 348/497 |
| 4,330,855 | A * | 5/1982 | Redfern et al. | 370/449 |
| 4,837,739 | A * | 6/1989 | McGill et al. | 710/100 |
| 5,502,576 | A * | 3/1996 | Ramsay et al. | 358/444 |
| 6,100,733 | A * | 8/2000 | Dortu et al. | 327/149 |
| 6,333,893 | B1 * | 12/2001 | Keeth et al. | 365/233 |
| 6,717,885 | B1 * | 4/2004 | Lai | 365/233 |
| 2001/0023489 | A1 * | 9/2001 | Llu et al. | 713/500 |
| 2003/0093702 | A1 * | 5/2003 | Luo et al. | 713/320 |
| 2004/0037158 | A1 * | 2/2004 | Coteus et al. | 365/233 |

* cited by examiner

*Primary Examiner*—Kevin Verbrugge
*Assistant Examiner*—Mehdi Namazi
(74) *Attorney, Agent, or Firm*—Blakely, Sokoloff, Taylor & Zafman LLP

(57) ABSTRACT

A memory system which includes a bank of memory chips, a memory interface, and a memory controller. The memory interface stretches a sample period for data from the bank of memory chips, and provides a sufficiently wide timing margin to enable the memory chips to work reliably across various process conditions.

17 Claims, 6 Drawing Sheets

MEMORY DATA STRETCHER

FIELD OF THE INVENTION

The present invention relates to a memory data operation; more specifically, the present invention relates to stretching memory data.

BACKGROUND OF THE INVENTION

Processor speeds are outpacing primary memory performance, with both processor designers and system manufacturers developing higher performance memory subsystems in an effort to minimize memory performance limitations. Ideally, the memory performance would match or exceed processor performance, i.e., a memory cycle time is less than one processor clock cycle. However, this often is not the case and, thus, the memory may be a system bottleneck.

There are two common families of RAM memory devices used as primary storage directly accessible by the microprocessor. A static random access memory device (SRAM) is based on flip-flop circuits and retains data as long as power is supplied. A dynamic random access memory device (DRAM) stores data as a function of a charge on a capacitor. The capacitor must constantly be refreshed since the charge dissipates. DRAMs are relatively inexpensive to fabricate but are slow as compared to SRAMS. SRAMs are therefore typically, reserved for use as caches. In both cases, data is clocked out of the RAM on either the rising or falling edge of a clock pulse.

Innovations in RAM technology have lead to a device referred to as the Double Data Rate (DDR) RAM. The DDR RAM allows reads and writes at twice the frequency of the applied clock (e.g., at frequencies greater than 400 to 600 MHz) by moving data on both rising and falling clock edges. However, to recognize the double-data-rate signal in the DDR architecture, the cache control logic of the processor may need to be modified. With normal cache SRAM, for each processor clock cycle the SRAM delivers one piece of data, whereas with DDR there is one piece of data on the rising edge and another piece of data on the falling edge of the clock. Furthermore, the high-end network application specific integrated circuit (ASIC) typically has a wide SRAM data interface which includes multiple high-speed DDR SRAM chips. Therefore, if one SRAM is faster than another SRAM, the data from the two SRAM chips may be skewed substantially enough to make synchronous data sampling difficult to achieve in such fast data interface environment.

SUMMARY OF THE INVENTION

In one aspect, a memory system is described. The system includes a bank of memory chips, a memory interface, and a memory controller. The memory interface stretches a sample period for data from the bank of memory chips and provides a sufficiently wide timing margin to enable the memory chips to work reliably across various process conditions. The memory interface controls the stretching of the sample period.

In another aspect, a method for extending a data sampling period is described. The method includes providing a bank of memory chips, stretching a sample period for data from the bank of memory chips by providing a sufficiently wide timing margin to enable the memory chips to work reliably across various process conditions, and controlling the stretching of the sample period.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

In recognition of the above-stated problems associated with a conventional data interface design of a double data rate (DDR) static random access memory (SRAM) device, embodiments for an improved memory input/output (I/O) interface design are described. Consequently, for purposes of illustration and not for purposes of limitation, the exemplary embodiments are described in a manner consistent with such use, though clearly the invention is not so limited.

Figure 1:
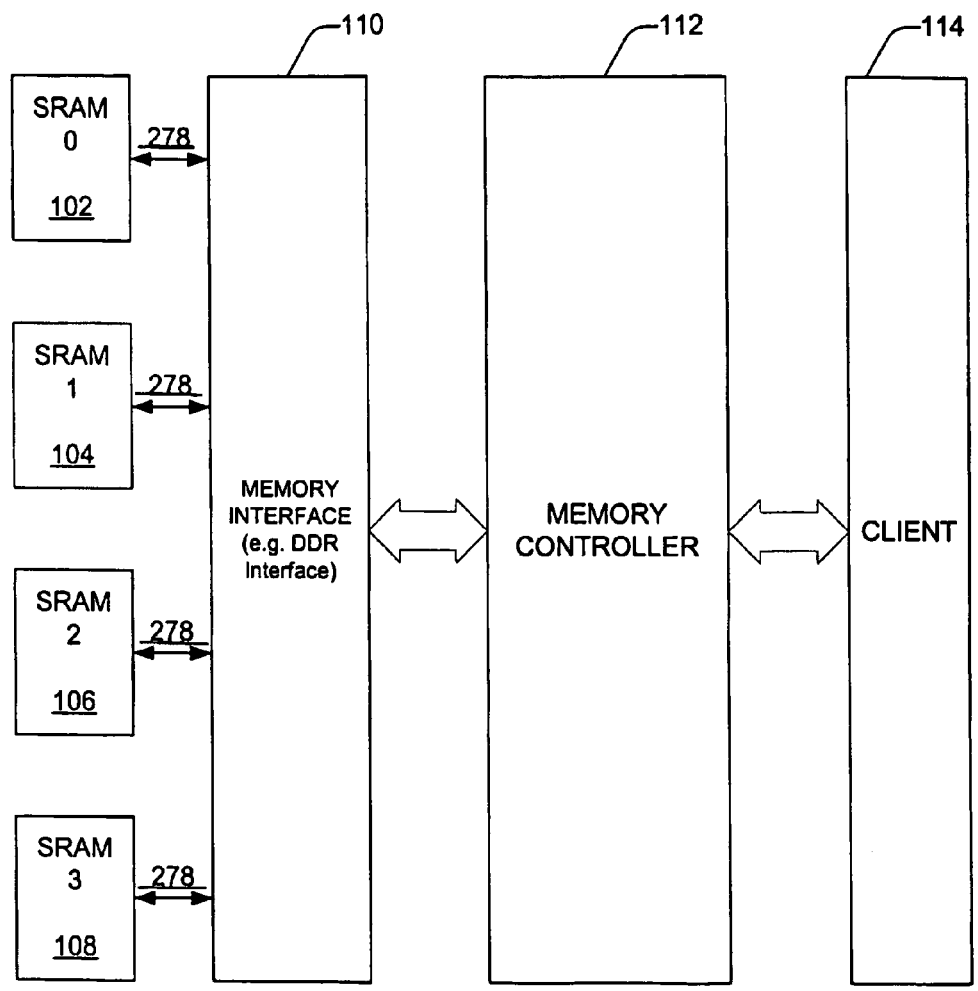
FIG. 1 is a block diagram of a memory system according to an embodiment of the invention.

FIG. 1 is a block diagram of one embodiment of a memory system 100. The memory system 100 interfaces with a client 114 such as a processor. In the illustrated embodiment, the memory system 100 includes a bank of memory chips 102–108, a memory interface 110, and a memory controller 112. In one embodiment, the memory chips 102–108 are static random access memory (SRAM) chips. In another embodiment, the memory chips 102–108 are double data rate (DDR) SRAM chips. Hence, in this embodiment, the memory interface 110 is a DDR SRAM interface.

The data stretching concept described above may be extended to any appropriate number of stages and use any appropriate frequency factors. For example, the input data 278 may be multiplexed at 2X, 4X, 6X, or any other appropriate factor of X.

Figure 2A:
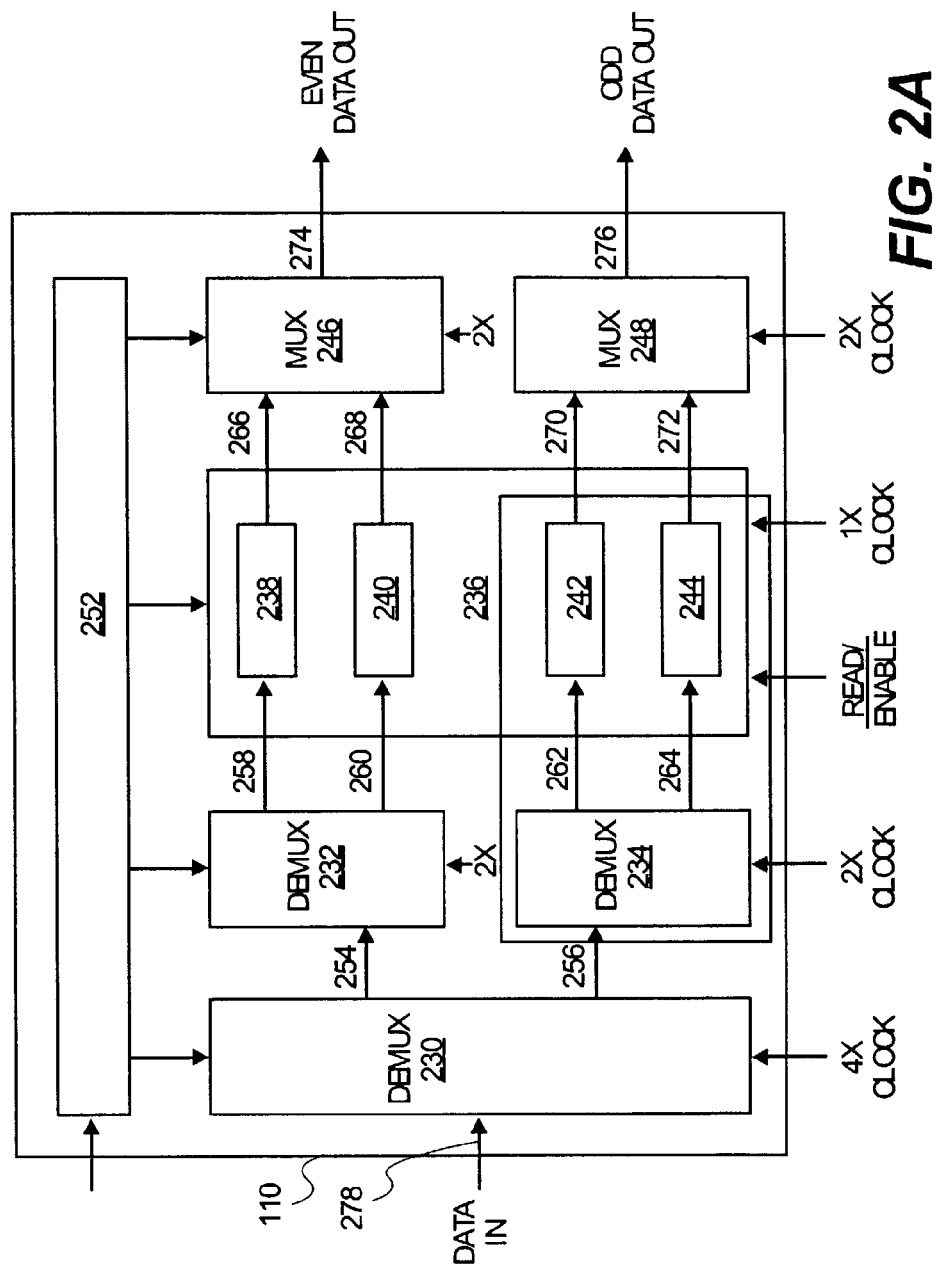
FIG. 2A is a block diagram of the memory interface in accordance with another embodiment of the invention where the input data is demultiplexed at two stages.

FIG. 2A is a block diagram of one embodiment of a memory interface 110 where the input data is demultiplexed at two stages. In the illustrated embodiment, a first data demultiplexer 230 receives the input data 278 and demultiplexes the data 278 into two portions referred to herein as data portions 254 and 256. In one embodiment, data portion 254 may be associated with a leading edge while data portion 256 may be associated with a trailing edge. The first demultiplexer 230 may operate at some frequency such as 4X, where X may be any appropriately applicable frequency. Data portions 254 and 256 are then transmitted to second and third demultiplexers 232 and 234, respectively, or further demultiplexing of the input data 278. The second demultiplexor 232 and third demultiplexer 234 may be clocked at 2X frequency. The second demultiplexer 232 produces data portions 258 and 260 while the third demultiplexer 234 produces data portions 262 and 264. Each of these data portions 258–264 may represent a single sampled SRAM data packet.

Data portions 258–264 are transmitted to a data stretcher 236 for processing. Data portions 258, 260, 262, 264 are processed over an extended or stretched duration by processors 238, 240, 242, and 244, respectively. The use of a stretched clock (stretched from ¼X to I/X) running at IX frequency enables processing of extended data portions 258–264. Outputs 266 and 268 of the processors 238 and 240, respectively, are multiplexed by a first multiplexer 246 that is running at 2X frequency. Outputs 270 and 272 of the processors 242 and 244, respectively are multiplexed by a second multiplexer 248 that is running at 2X frequency. Outputs 274 and 276 of the first and second multiplexers 246 and 248, respectively, are fed to the memory controller (e.g., memory controller 112). In one embodiment, outputs 274 and 276 represent the even and odd data outputs.

Figure 2B:
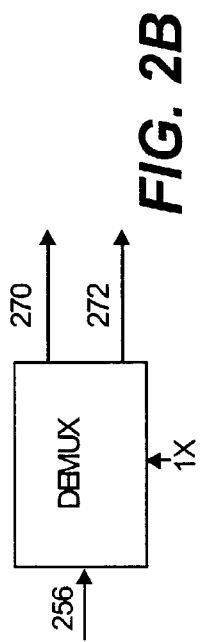
FIG. 2B illustrates an alternative demultiplexer portion of the memory interface of FIG. 2A.

In one embodiment, demultiplexor 234 and processors 242 and 244 are replaced with a demultiplexor that is clocked with a 1X clock, such as is shown in FIG. 2B.

The memory interface 110 may also include other related support circuit 252 such as timing generator/synchronizer.

Figure 3:
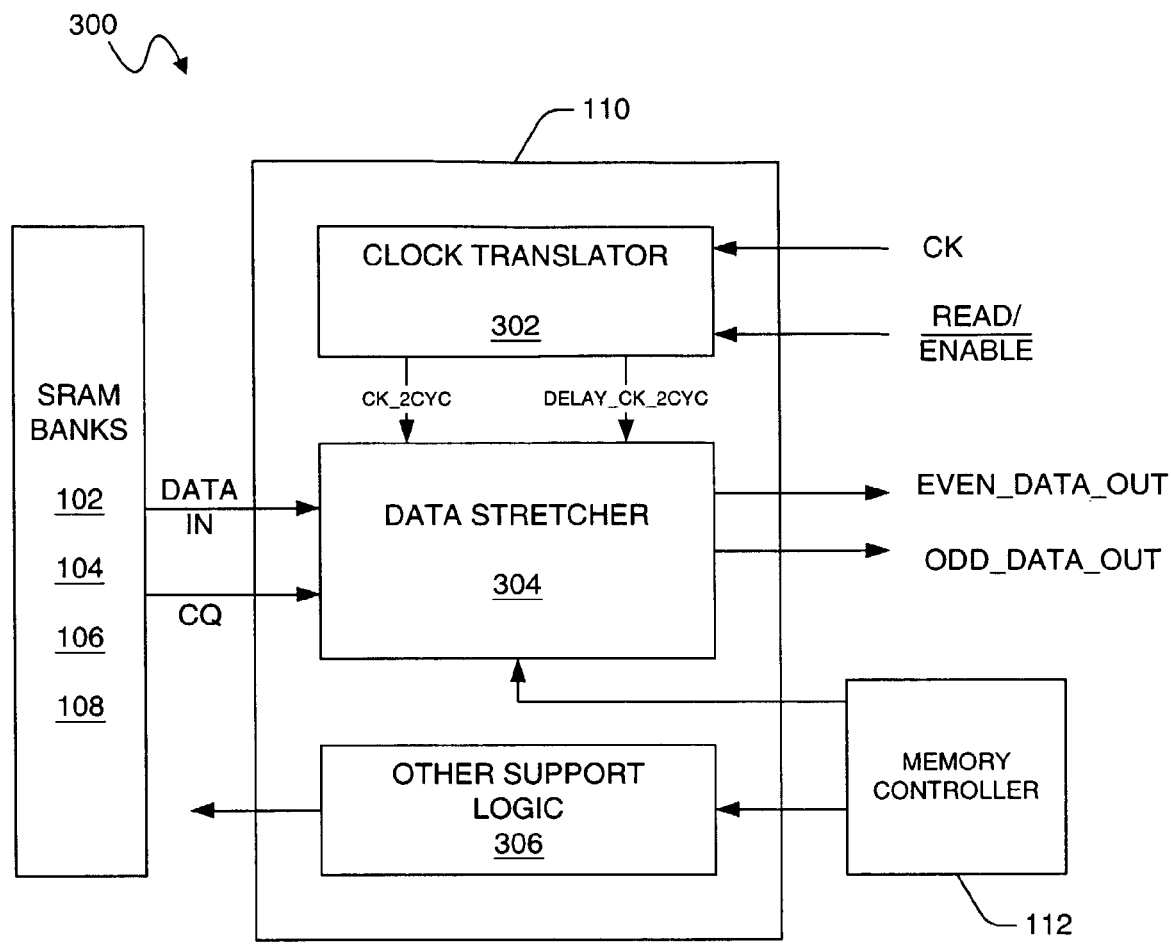
FIG. 3 is a function block diagram of the memory system according to an embodiment of the invention.

FIG. 3 is a function block diagram of one embodiment of memory system 300. Like the memory system 100, the memory system 300 includes a bank of SRAMS 102–108, a memory interface 110, and a memory controller 112. The memory interface 110 includes a clock translator 302 that receives the clock (CK) that drives the RAM chips and stretches the clock duration by an appropriate amount to allow sampling of data with a sufficiently wide timing margin. In one embodiment, the memory control clock (CK) is a delayed version of the import clock CLK that is used to drive the SRAM chips (see FIG. 5). The stretched clock is then supplied to a data stretcher 304 for processing and reading of the sampled data. The memory interface 110 may also include other support logic circuits 306.

Figure 4A:
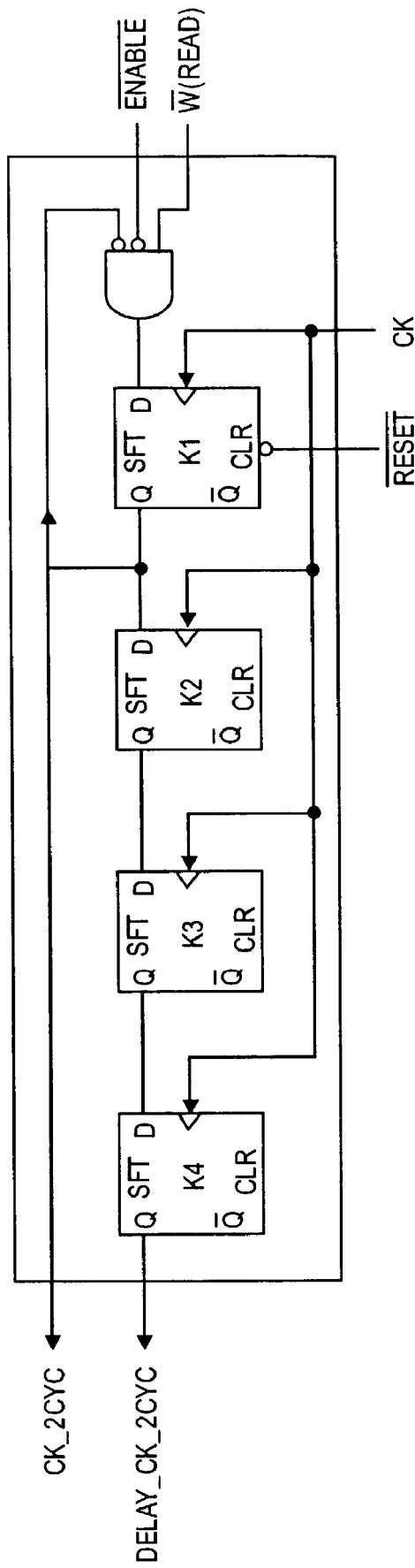
FIG. 4A is a circuit diagram of a clock translator in accordance with an embodiment of the invention.

In one embodiment, a circuit diagram of the clock translator 302 is illustrated in FIG. 4A. In the illustrated embodiment, the flip-flop K1 receives the memory control clock (CK) and generates a 2-cycle stretched clock (CK-2CYC). In a typical application, the memory control clock (CK) may include an ASIC clock. Furthermore, in this embodiment, the 2-cycle clock is activated only when there is a read option to perform. This saves power. The generation of the 2-cycle clock may be set again with RESET signal. In the illustrated embodiment, flip-flops K2–K4 also generate a delayed 2-cycle clock referred to as DELAY-CK-2CYC for later use in the data stretcher 304.

Figure 4B:
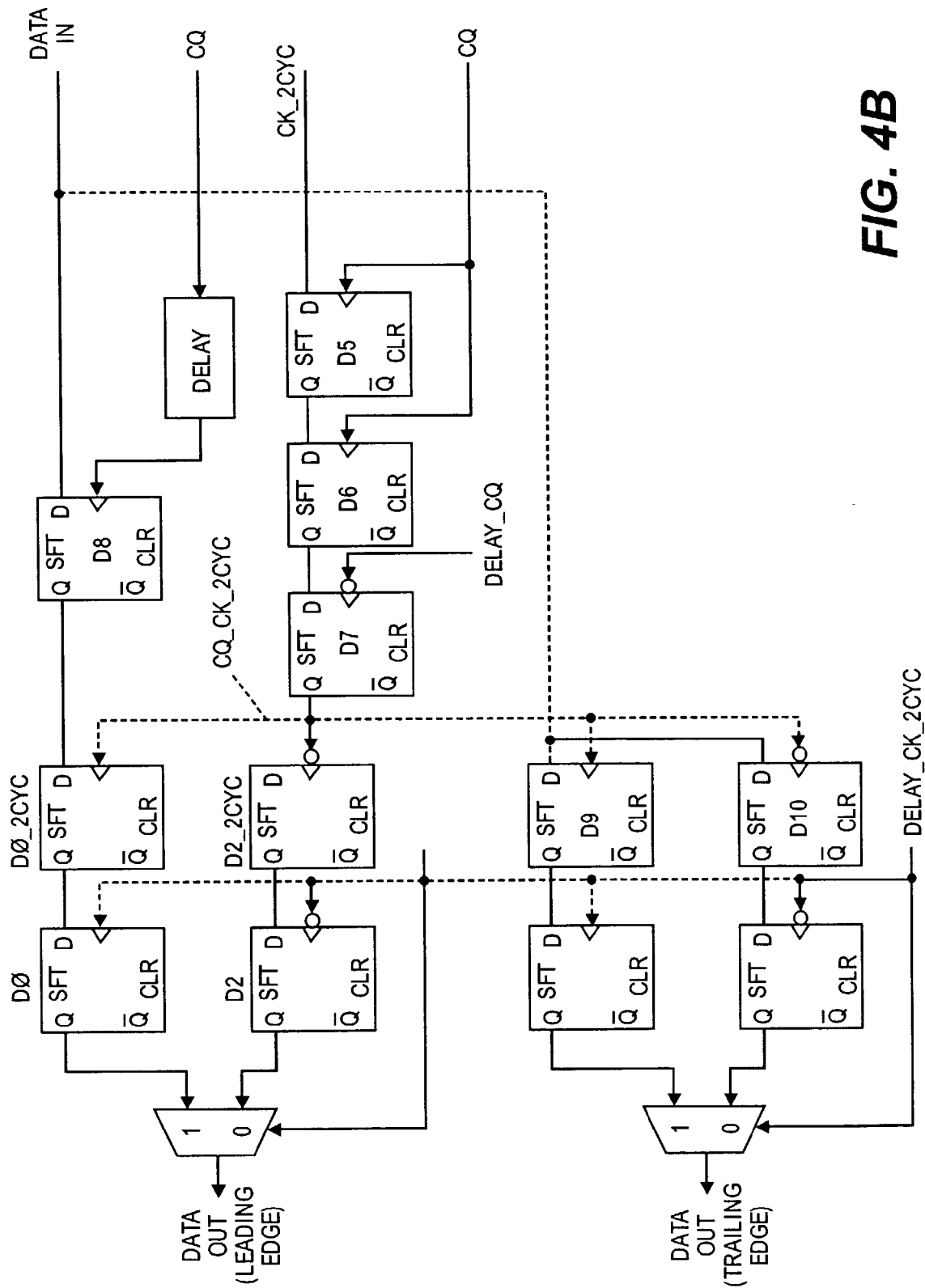
FIG. 4B is a circuit diagram of a data stretcher according to an embodiment of the invention.

One embodiment of a circuit diagram of the data stretcher 304 is illustrated in FIG. 4B. The data stretcher 304 is designed to resolve the problem of data skew among a bank of SRAM chips 102–108. In the illustrated embodiment, the data rate flow is demultiplexed from 4X input rate to two 2X rate branches (one on the leading edge and the other on the trailing edge). Specifically, for the leading, or rising edge, flip-flop D8 and a DELAY element enable DATA IN arriving at leading (rising) edge to be demultiplexed from 4X rate to 2X rate. The 2X rate branch is then further demultiplexed into two 1X rate branches. For the trailing (falling) edge path, flip-flops D9 and 10 enable DATA IN arriving at the trailing (falling) edge to be demultiplexed from the 4X rate directly to the 1X rate.

The data stretcher 304 also generates a 2-cycle hybrid clock (CQ-CK-2CYC) to stretch 2X to 1X at the leading (rising) edge path and 4X to 1X at the trailing (falling) edge, in addition to synchronizing the SRAM data clocked by the SRAM data clock (CQ) to the memory control clock (CK). Specifically, flip-flops D5 and D6 receive CK-2CYC clocked in with SRAM clock CQ. The output of flip-flop D6 is then fed into flip-flop D7 clocked in with inverted DELAY-CQ clock to generate CQ-CK-2CYC clock. Since the CK-to-CQ delay has a bound value that is less than the cycle time of the CK, the CK-2CYC clock, by using CQ, can be converted to a 2-cycle CQ-domain hybrid clock (CQ-CK-2CYC). The SRAM data is stretched to two cycles by the hybrid clock (CQ-CK-2CYC).

Furthermore, the stretch allows the SRAM data with various rates to have a wide overlapped data valid window. Therefore, at relatively slow 1X rate (i.e. the stretched window), the data is sampled from SRAM clock domain (CQ) to the memory control clock domain (CK). Since the stretched window is sufficiently wide, the delayed 2-cycle sampling clock (DELAY_CK_2CYC) provides wide timing margin to enable the memory circuit to work reliably across various process conditions.

The clock path is designed to migrate the SRAM data clock (CQ) domain to 2-cycle client clock (CK_2CYC) domain to enable 4X to 1X multiplexing. Thus, the clock path runs from SRAM data clocks (CQ and DELAY_CQ) to the hybrid clock (CQ_CK_2CYC) to the client clock (DELAY_CK_2CYC). This clock migration path substantially avoids the possible meta-stability that occurs in the conventional synchronizer. In the illustrated embodiment, the SRAM data clock (CQ) is used to demultiplex 4X rate data to two 2X rate data. The hybrid clock (CQ_CK_2CYC) is then used to demultiplex the 2X rate data to two 1X rate data. Finally, the delayed 2-cycle client clock (DELAY_CK_2CYC) is used to sample the SRAM data at relatively slow 1X rate having wide timing margin.

Figure 5:
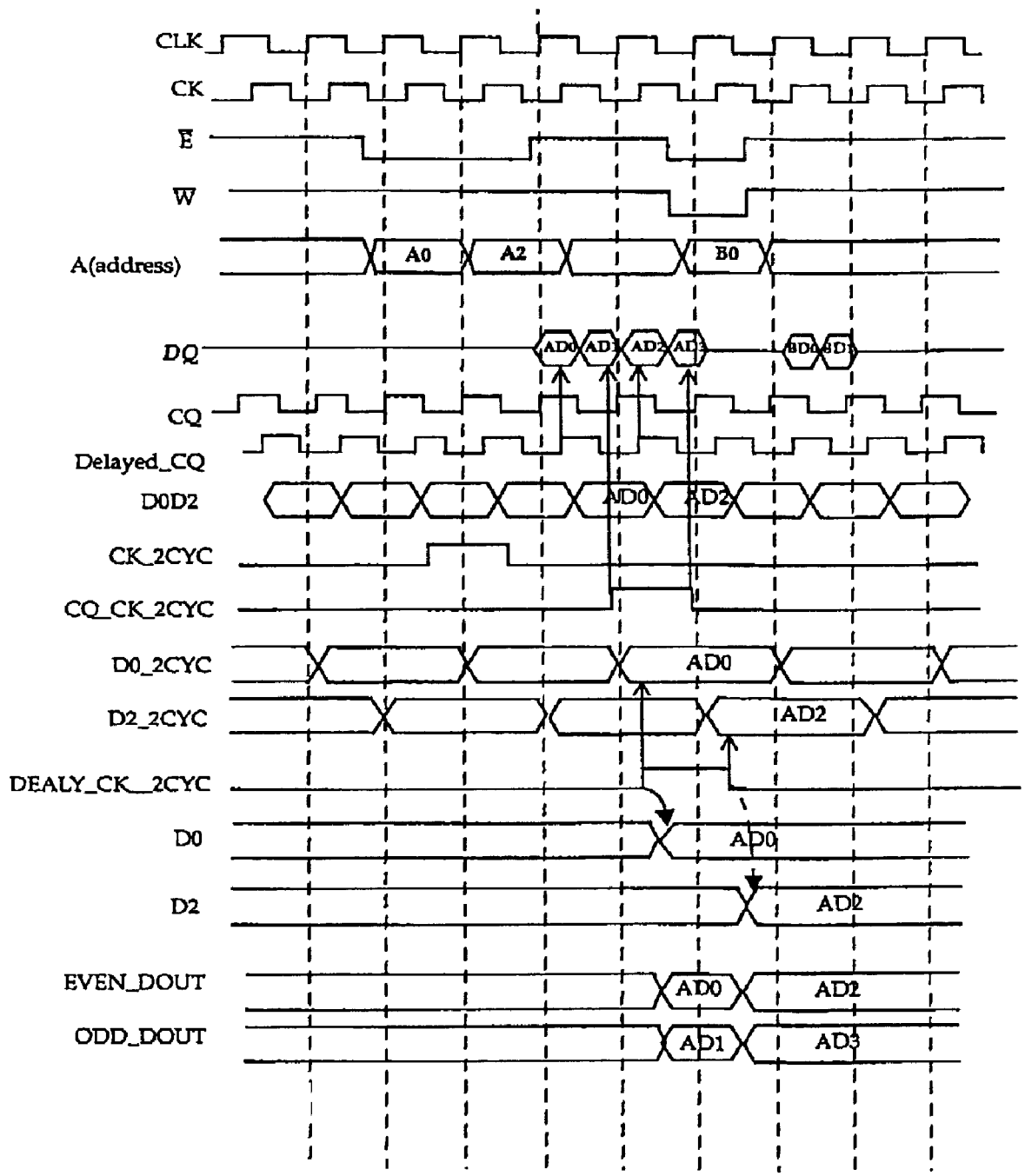
FIG. 5 is a timing diagram of the memory system in accordance with an embodiment of the invention.

FIG. 5 is a timing diagram of one embodiment of memory system 100. In the illustrated embodiment, the DELAY-CK-2CYC clock enables the input data (DO-2CYC and D2-2CYC) to be sampled over the period of two clock cycles.

There has been disclosed herein embodiments for an improved DDR SRAM input/output (I/O) interface design. The SRAM I/O interface design includes a clock translator and a data stretcher that provide sufficiently wide timing margin to enable the memory circuit to work reliably across various process conditions.

While specific embodiments of the invention have been illustrated and described, such descriptions have been for purposes of illustration only and not by way of limitation. Accordingly, throughout this detailed description, for the purposes of explanation, numerous specific details were set forth in order to provide a thorough understanding of the invention. It will be apparent, however, to one skilled in the art that the embodiments may be practiced without some of these specific details. For example, although the data stretcher design has been described in terms of binary multiplexing of data rate into a plurality of rate branches, the above-described design and concept may be extended to any type of multiplexing that provides sufficiently wide timing margin for data sampling tasks. In other instances, well-known structures and functions were not described in elaborate detail in order to avoid obscuring the subject matter of the invention. Accordingly, the scope and spirit of the invention should be judges in terms of the claims which follow.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

I claim:

1. A memory system, comprising:
   a bank of memory chips;
   a memory interface to stretch a sample period for data from the bank of memory chips, the memory interface to provide a sufficiently wide timing margin to enable the memory chips to work reliably across various process conditions, the memory interface comprising a clock translator to receive an input clock from a client and to generate an output clock whose period is stretched to be longer than the period of the input clock; and
   a client interface module to receive the output data from the memory interface, and to transmit the output data to a client.

2. The system of claim 1, wherein the clock translator further receives a read signal from the memory interface.

3. The system of claim 1, wherein the memory interface includes a receiver for a first clock corresponding to the data from the bank of memory chips.

4. The system of claim 3, wherein the memory interface further includes a plurality of latch circuits that receives the first clock and the output clock, and produces a hybrid clock that enables sampling of the data from the bank of memory chips with relatively wide timing margin.

5. A method for extending a data sampling period, comprising:
   stretching a sample period for data from a bank of memory chips by providing a sufficiently wide timing margin to enable the memory chips to work reliably across various process conditions;
   controlling the stretching of the sample;
   demultiplexing the data from the bank of memory chips into a plurality of data parts; and
   combining the plurality of data parts into an output data clocked at same rate as that of a clock associated with the data from the bank of memory chips.

6. The method of claim 5, wherein stretching a sample period includes sampling the plurality of data parts with a stretched clock running at a rate slower than that of the data from the bank of memory chips.

7. A method for extending a data sampling period, comprising:
   receiving an input clock and generating an output clock whose period is stretched to be longer than the period of the input clock; and
   stretching a sample period for data from a bank of memory chips by providing a sufficiently wide timing margin using the output clock to enable the memory chips to work reliably across various process conditions, wherein the bank of memory chips includes a plurality of static random access memory (SRAM) chips.

8. The method of claim 7, wherein stretching a sample period includes receiving a first clock corresponding to the data from the bank of memory chips.

9. The method of claim 8, wherein stretching a sample period includes receiving the first clock and the output clock, and producing a hybrid clock that enables sampling of the data from the bank of memory chips with relatively wide timing margin.

10. A memory data stretcher system, comprising:
    a first demultiplexer to demultiplex input data from double data rate (DDR) static random access memory (SRAM) chips into a plurality of data parts;
    a processor to process the plurality of data parts from the first demultiplexer such that a data sampling period of the data is extended by providing a sufficiently wide timing margin to enable the DDR SRAM chips to work reliably across various process conditions; and
    a first multiplexer to combine the plurality of data parts from the processor into output data clocked at the same rate as that of a clock associated with the input data.

11. The system of claim 10, further comprising:
    a second demultiplexer to further demultiplex the plurality of data parts into subparts before sending the subparts to the processor.

12. The system of claim 11, further comprising:
    a second multiplexer to combine the subparts into data parts before sending the combined data parts into the first demultiplexer.

13. A memory system, comprising:
    a first demultiplexer to demultiplex input data from a plurality of static random access memory (SRAM) chips into a plurality of data parts;
    a data stretcher to process the plurality of data parts such that a data sampling period of the data is extended by providing a sufficiently wide timing margin to enable the SRAM chips to work reliably across various process conditions; and
    a first multiplexer to combine the plurality of data parts from the processor into output data clocked at the same rate as that of a clock associated with the input data.

14. The system of claim 13, further comprising:
    a second demultiplexer to further demultiplex the plurality of data parts into subparts before sending the subparts to the processor.

15. The system of claim 13, further comprising:
    a second multiplexer to combine the subparts into data parts before sending the combined data parts into the first demultiplexer.

16. The system of claim 13, wherein the processor processes the data portions from the first demultiplexer over a stretched clock.

17. The system of claim 13, wherein a first data portion demultiplexed by the first demultiplexer is associated with a leading edge and a second data portion demultiplexed by the first demultiplexer is associated with a trailing edge.

* * * * *